(12) United States Patent
Liu

(10) Patent No.: US 7,178,587 B2
(45) Date of Patent: Feb. 20, 2007

(54) HEAT-DISSIPATING MODULE

(75) Inventor: Wen-Hao Liu, Taipei (TW)

(73) Assignee: Asia Vital Component Co., Ltd., Kaohsiung (TW)

( * ) Notice: Subject to any disclaimer, the term of this patent is extended or adjusted under 35 U.S.C. 154(b) by 122 days.

(21) Appl. No.: 11/015,106

(22) Filed: Dec. 20, 2004

(65) Prior Publication Data

US 2006/0131000 A1   Jun. 22, 2006

(51) Int. Cl.
*H05K 7/20* (2006.01)

(52) U.S. Cl. .............. 165/185; 165/80.3; 165/121; 361/697

(58) Field of Classification Search .......... 165/80.3, 165/121, 185; 361/695, 697
See application file for complete search history.

(56) References Cited

U.S. PATENT DOCUMENTS

| | | | | |
|---|---|---|---|---|
| 3,727,114 A * | 4/1973 | Oshima | ........................ | 257/726 |
| 4,682,268 A * | 7/1987 | Okano et al. | ................ | 361/697 |
| 5,335,722 A * | 8/1994 | Wu | ............................ | 165/122 |
| 5,353,863 A * | 10/1994 | Yu | ............................ | 165/80.3 |
| 5,810,072 A * | 9/1998 | Rees et al. | .................. | 165/80.3 |
| 6,199,624 B1 * | 3/2001 | Wotring | ...................... | 165/80.3 |
| 6,310,771 B1 * | 10/2001 | Chien | ......................... | 361/697 |
| 6,360,816 B1 * | 3/2002 | Wagner | ...................... | 165/80.3 |
| 6,407,919 B1 * | 6/2002 | Chou | .......................... | 361/697 |
| 6,538,888 B1 * | 3/2003 | Wei et al. | .................... | 361/697 |
| 6,570,760 B1 * | 5/2003 | Wang | ......................... | 361/687 |
| 6,621,699 B2 * | 9/2003 | Watanabe et al. | .......... | 361/697 |
| 6,781,838 B2 * | 8/2004 | Shinotou | .................... | 361/704 |
| 6,798,663 B1 * | 9/2004 | Rubenstein | ................. | 361/710 |
| 6,816,374 B2 * | 11/2004 | Patel et al. | .................. | 361/697 |
| 6,822,864 B2 * | 11/2004 | Huang et al. | ............... | 361/697 |
| 2003/0142478 A1 * | 7/2003 | Huang et al. | ............... | 361/704 |
| 2004/0050536 A1 * | 3/2004 | Watanabe et al. | ...... | 165/104.33 |
| 2004/0201961 A1 * | 10/2004 | Ko et al. | ..................... | 361/695 |
| 2006/0120042 A1 * | 6/2006 | Liu et al. | .................... | 361/695 |

* cited by examiner

*Primary Examiner*—Leonard R. Leo

(57) ABSTRACT

A heat-dissipating module comprises a conductive part, a fan and a flow-guiding shield. The conductive part has a receiving plane being connected to the fan and fits with the flow-guiding shield. The fan has a fan wheel with a circular area measured with the diameter thereof greater than the receiving plane so that the fan wheel extends outward the receiving plane. The flow-guiding shield provides an inlet and an outlet and at least a guiding part is disposed at the inlet side. The guiding part receives fluid from the fan and the outlet fits with the conductive part. The fluid dragged by the fan wheel is received by and guided with the guiding part toward the conductive part.

5 Claims, 25 Drawing Sheets

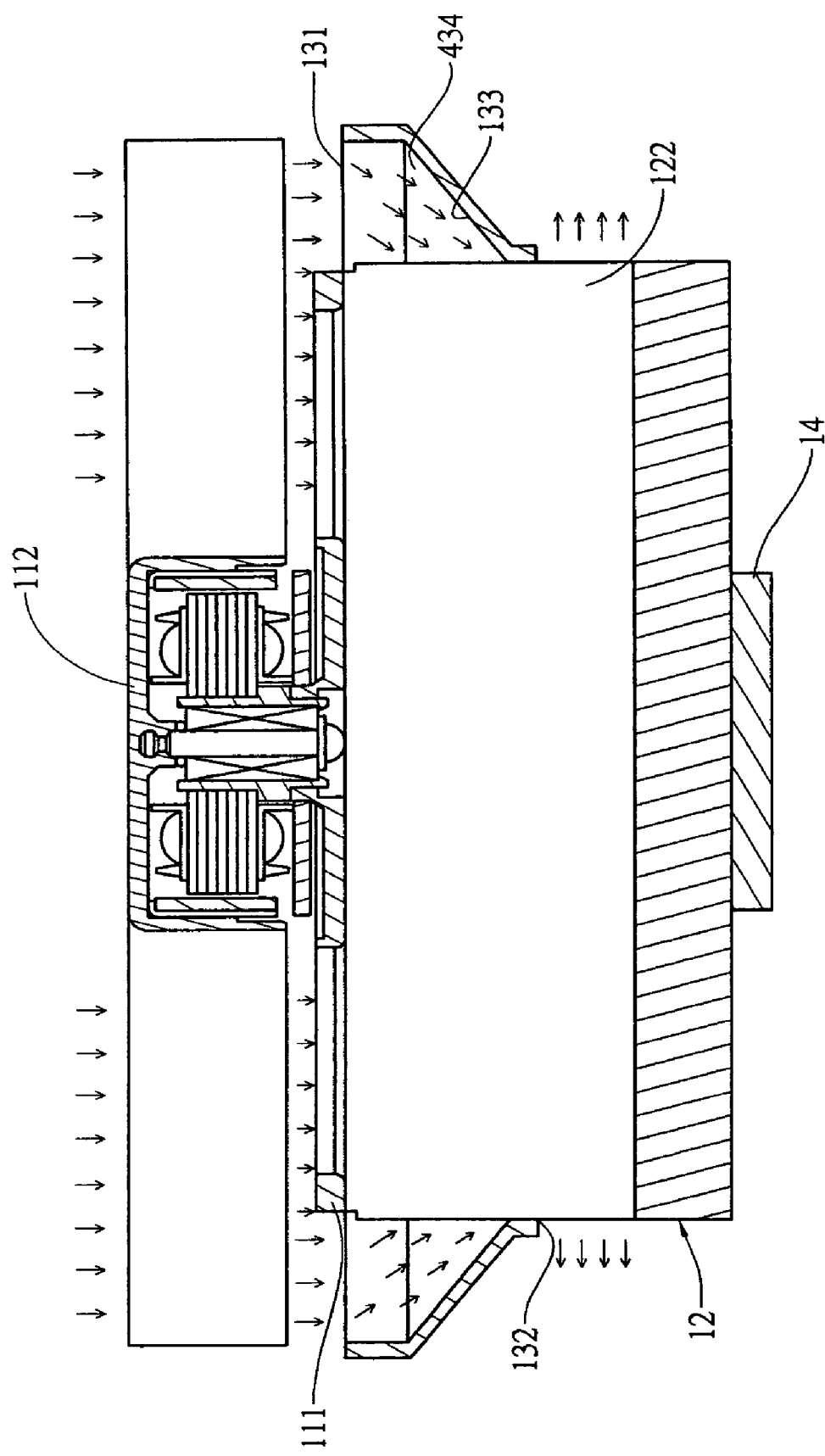

HEAT-DISSIPATING MODULE

BACKGROUND OF THE INVENTION

1. Field of the Invention

The present invention is related to a heat-dissipating module and particularly to heat-dissipating module, in which the fan flow passages provide the area thereof greater than the receiving plane of the radiator.

2. Brief Description of the Related Art

Due to semiconductor industry developing rapidly, the electronic components is developed toward minimization and high frequency and problem of high heat generation is accompanied with high power of the powerful electronic components. The high heat emitted from unit area of the electronic components has become a non-ignorable heat source. If the heat it is not removed, normal operation of the electronic components is influenced with the extremely high temperature thereof and it results in unsteady system. In order to remove excessive heat of the electronic components, providing a cooling system is essential to solve different stages of heat problems.

In order to maximize the function of the electronic components and the machine, sufficient heat dissipation is very important so that factors, which have to be considered during designing a cooling system effectively, are (1) heat amount generated by the component; (2) the space size and weight limitation; (3) temperature in the work environment; (4) the cost of the cooling system; and (5) fluid used with the cooling system. The technology and semi-conductor manufacturing process progress rapidly lead to time pulses of the electronic components and chips being upgraded incessantly. For the ordinary computer, the main heat source is from the microprocessor, north and south bridge chips on the main board, high performance chip on VGA, hard disk, CD drive and power supply. The microprocessor with higher frequency can even emit heat with hundred watts and the heat is equivalent a hot metal plate. It is surprising heat and it is probably more serious in the near future under the condition of fast technology development. Of course, the north and south bridge chips, the hard disk or 3D plotting VGA may increase heat generation to influence the operation performance of the entire system in the future in addition to the microprocessor. Hence, how to find a good cooling method is a very important subject. However, for the problem of heat dissipation, space is a great factor has to be considered. If heat is incapable of moving outward, temperature of the system keeps rising in a high heat system. How to remove heat in a limited space fast and efficiently is a much harder work.

The computer available on the market mostly has limited space so that a small size fan is usually mounted to the cooling fins before the cooling fins are attached to a heat generating part to perform heat dissipation work.

Further, how to promote cooling method and technology and to allow the system effective operation fast are common subjects researched by the industry and academy. The cooling ways currently used have natural convection cooling, forced convection cooling, liquid direct or indirect cooling and phase change cooling.

The most popular cooling way is forced convection cooling because air is an indispensable and easily obtained fluid without the need of cost and power. Generally, a fan associated with radiator as a unit is used for dissipating high heat generation mechanism. The fan acts to drive the air for achieving the purpose of forced convection and the radiator acts to provide high heat conductivity and surface area contacting with the air for intensify the cooling effect. Hence, the radiator is made of good conductivity such as aluminum alloy or steel and the larger the surface area contacting with the air is, the better the cooling effect is.

The fan has advantages such as simple structure, low cost, least damage and less driven energy source so that it is popularly used. For the axial flow fan, the air flow can be guided and blown outward along a direction parallel to the central shaft of the fan blades and the advantages of the axial flow fan has features such as small static pressure and large flow rate such that it is mostly utilized in low resistance location. The fan adopted in the general cooling system, which is less resistance in addition to problem in design, is the axial flow fan because the axial flow fan is suitable for environment with large air and low pressure.

Further, Taiwanese Patent Official Gazette Publication No, 527089 discloses a flow-guiding device of a cooling device and the cooling device itself. The cooling device includes a flow-guiding pipe with a front opening, a rear opening and multiple inner flow-guiding baffles. The front opening provides an area greater than the rear opening and connects with the outlet of a fan. The rear opening is connected to the cooling fins such that the air can move into the guiding pipe via the front opening during the fan rotates and the then the air is guided with the guiding baffles to move outward via the rear opening to remove heat transmitted with cooling fins.

However, problem of the preceding prior art while in use are the fan being far from the heat source and influencing heat dissipating effect due to the guiding device being dispose between the fan and the cooling fins. Further, the height of the guiding device is a distance has to be passed over by the fluid moving outward via the outlet of the fan so that it results in wasting kinetic energy of the fluid. In addition, the fluid at the outlet of the fan is low but temperature of the fluid increases during passing through the guiding pipe so that the fluid at the cooling fins provides temperature higher than that at the outlet of the fan to degrade heat exchange rate between the fluid and the cooling fins. The preceding problems significantly deduct the heat dissipating effect.

SUMMARY OF THE INVENTION

An object of the present invention is to provide a heat-dissipating module in which a flow-guiding shield fits with the periphery of the conductive part to receive and guide fluid driven by a fan attached to a receiving plane of the conductive part.

The heat-dissipating module according to the present invention comprises a conductive part, a fan and a flow-guiding shield. The conductive part has a receiving plane being connected to the fan and fits with the flow-guiding shield. The fan has a fan wheel with a circular area measured with the diameter thereof greater than the receiving plane so that the fan wheel extends outward the receiving plane. The flow-guiding shield provides an inlet and an outlet and at least a guiding part is disposed at the inlet side. The guiding part receives fluid from the fan and the outlet fits with the conductive part. The fluid dragged by the fan wheel is received by and guided with the guiding part toward the conductive part.

BRIEF DESCRIPTION OF THE DRAWINGS

The detail structure, the applied principle, the function and the effectiveness of the present invention can be more fully understood with reference to the following description and accompanying drawings, in which:

FIG. 19 is a sectional view of the fifth embodiment of a heat-dissipating module according to the present invention illustrating being applied to a heat emitting part;

DETAILED DESCRIPTION OF THE INVENTION

Figure 1:
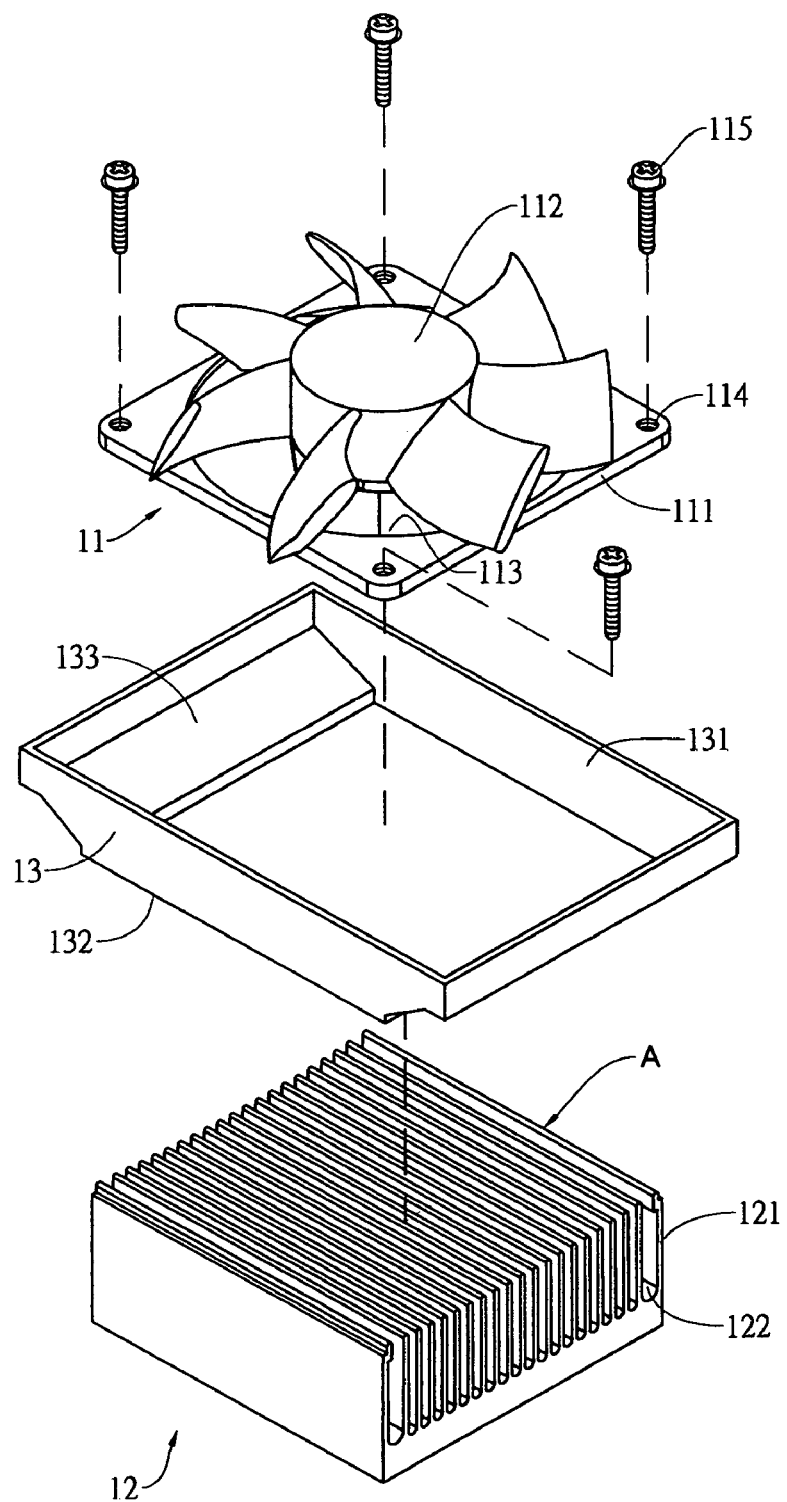
FIG. 1 is an exploded perspective view of the first embodiment of a heat-dissipating module according to the present invention.
Figure 2:
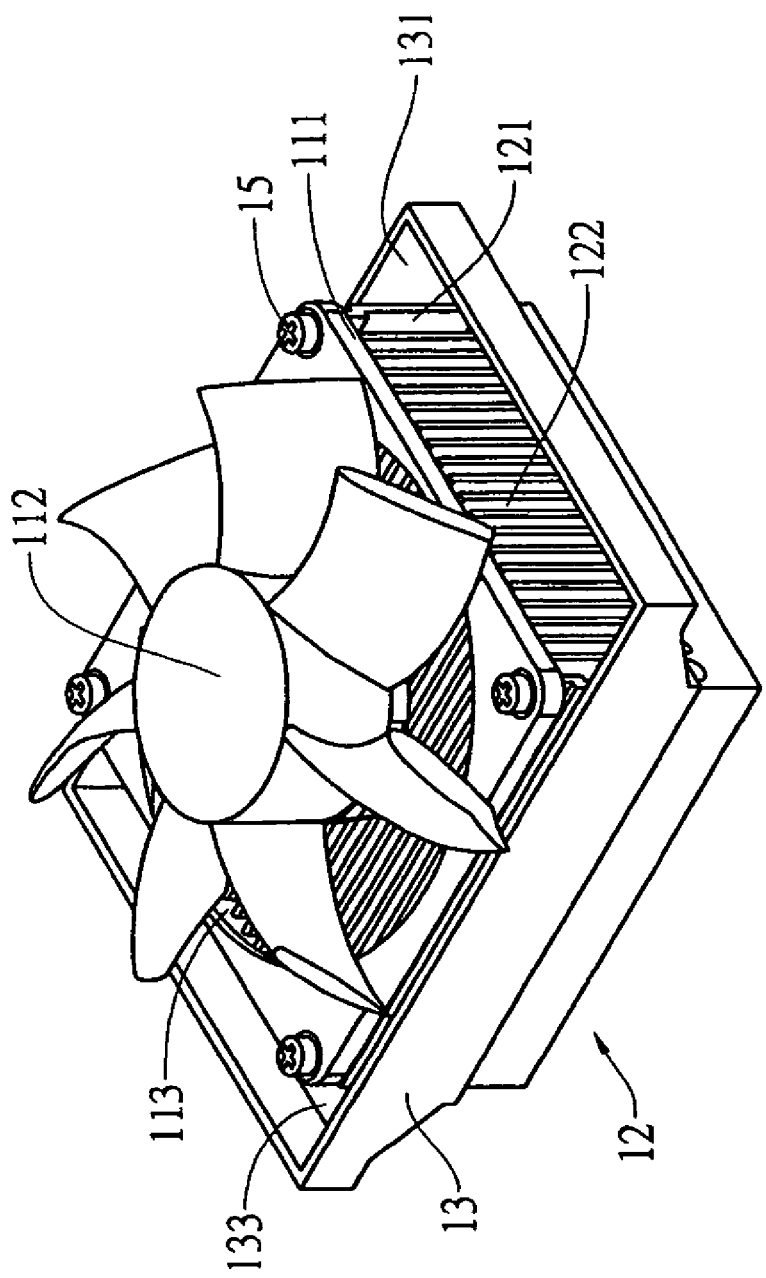
FIG. 2 is an assembled perspective view of the first embodiment of a heat-dissipating module according to the present invention.

Referring to FIGS. 1 and 2, the first embodiment of a heat-dissipating module according to the present invention comprises a fan 11, a conductive part 12 and a flow-guiding shield 13. The conductive part 12 is a radiator in the present embodiment and provides a plurality of parallel cooling fins 121. A flow passage 122 is formed between every two of the cooling fins 121 next to each other respectively and the respective flow passage 122 communicates with two sides of the conductive part 12. The cooling fins 121 and the respective flow passage 122 define a quadrilateral shaped receiving plane A. The fan 11 has a base 111 and a fan wheel 112 mounted to the base 111. The base 111 provides an area being equal or less than the receiving plane A and has a hollow opening 113 with the axis passing through the center of the base 111. The base 111 has a through hole 114 at four corners thereof respectively for being passed through with a fastener 115 respectively. The fan wheel 112 provides the circular area thereof being greater than the area of the receiving plane A. The flow-guiding shield 13 has an inlet 131 and an outlet 132 with a diverging shaped guiding part 133 to guide fluid from the fan 11.

During the heat-dissipating module of the present invention being set up, the flow-guiding shield 13 is mounted to the upper periphery of the conductive part 12 with the outlet 132 being flush with the outer edge of the conductive part 12, that is, the conductive part 12 partly fits with the flow-guiding shield 13. Then, the fan 11 is attached to the receiving plane A by way of the fastener 15 passing through the through hole 114 engaging with the receiving plane A. The fan wheel 112 has the circular area thereof greater than the receiving plane A such that the fan wheel 112 extends outward the receiving plane A. The inner wall of the guiding part 133 at the side of the inlet 131 provides a slant shape and corresponds to the flow passages 122 at both sides of the conductive part 12. In other words, the guiding part 133 provides two opposite guiding members at the side of the inlet 131. When the flow-guiding shield 13 partly fits with the conductive part 12, the guiding part 133 can corresponding to the flow passages 122 adjacent to both sides of the conductive part 12.

Figure 3:
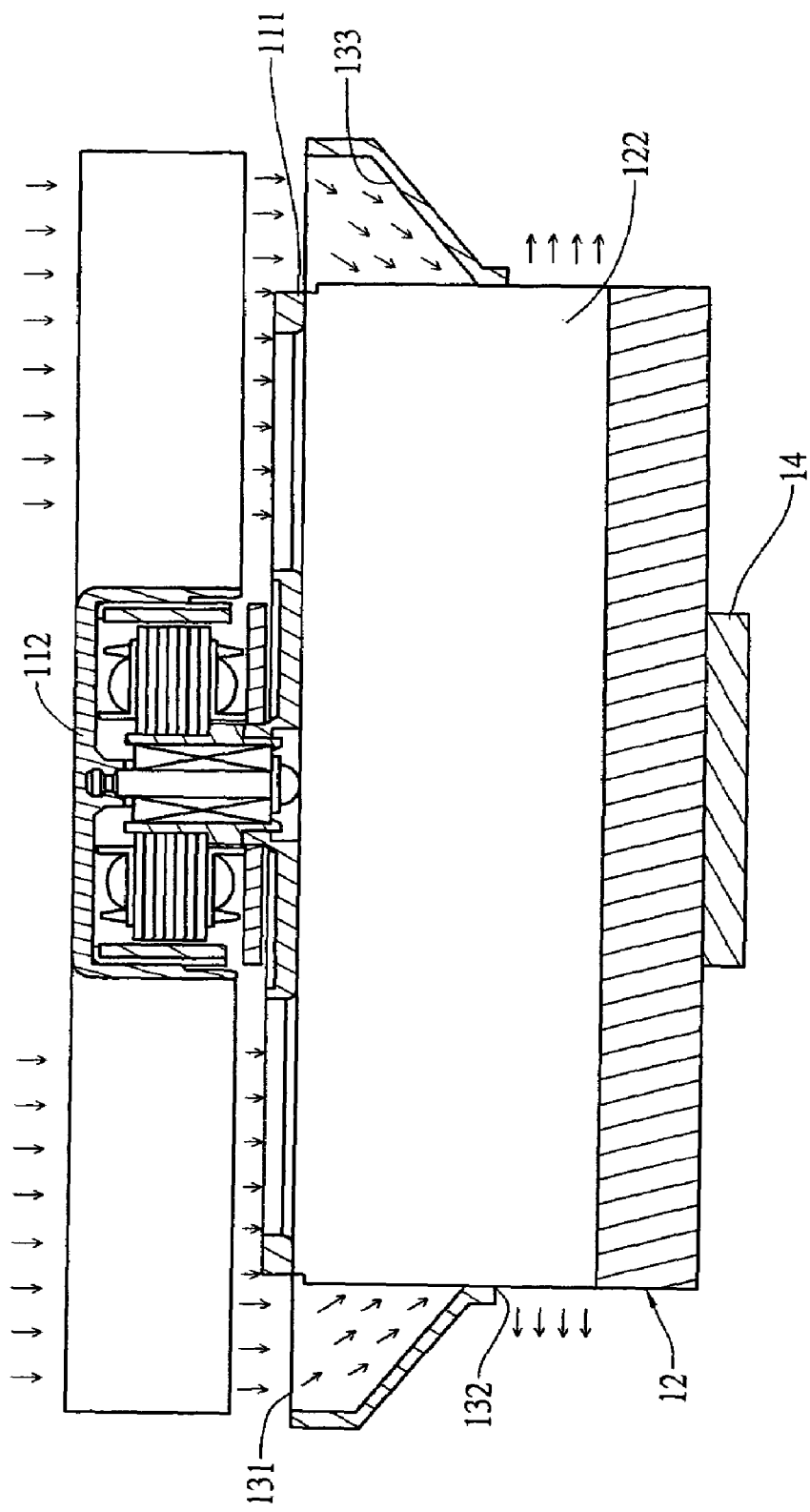
FIG. 3 is a sectional view of the first embodiment of a heat-dissipating module according to the present invention illustrating being applied to a heat emitting part.
Figure 4:
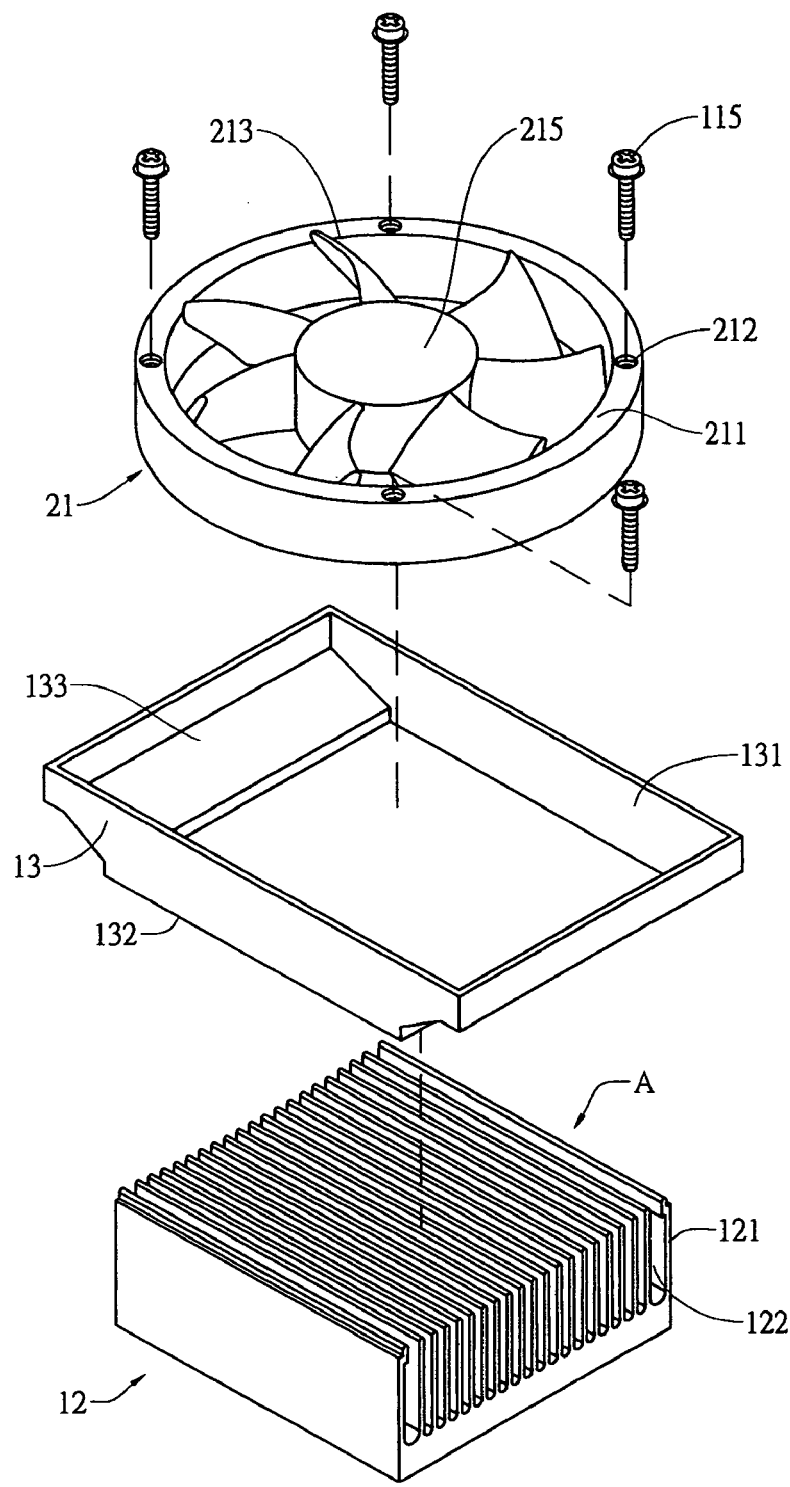
FIG. 4 is an exploded perspective view of the second embodiment of a heat-dissipating module according to the present invention.
Figure 5:
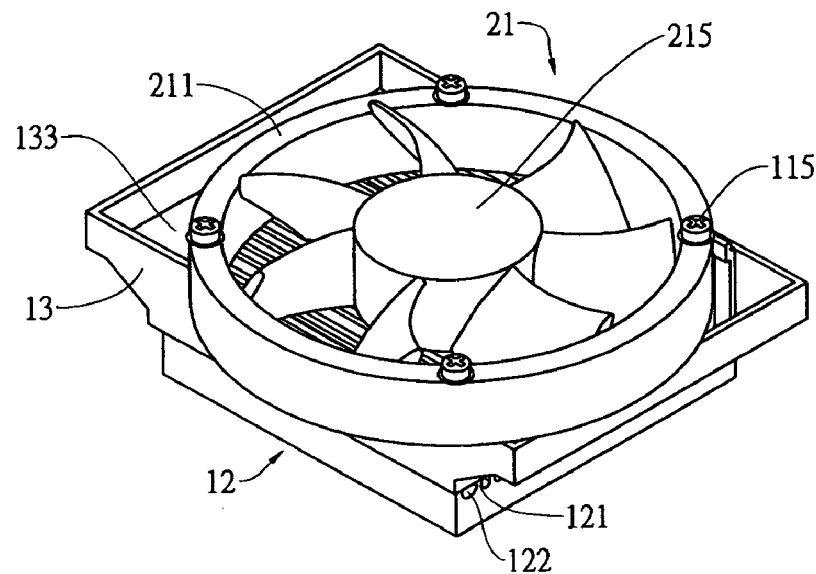
FIG. 5 is an assembled perspective view of the second embodiment of a heat-dissipating module according to the present invention.
Figure 6:
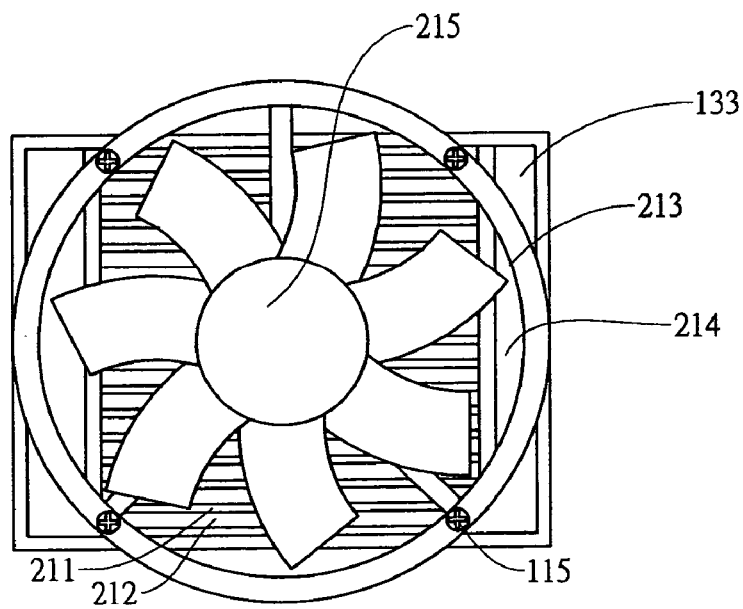
FIG. 6 is a top view of FIG. 5.
Figure 7:
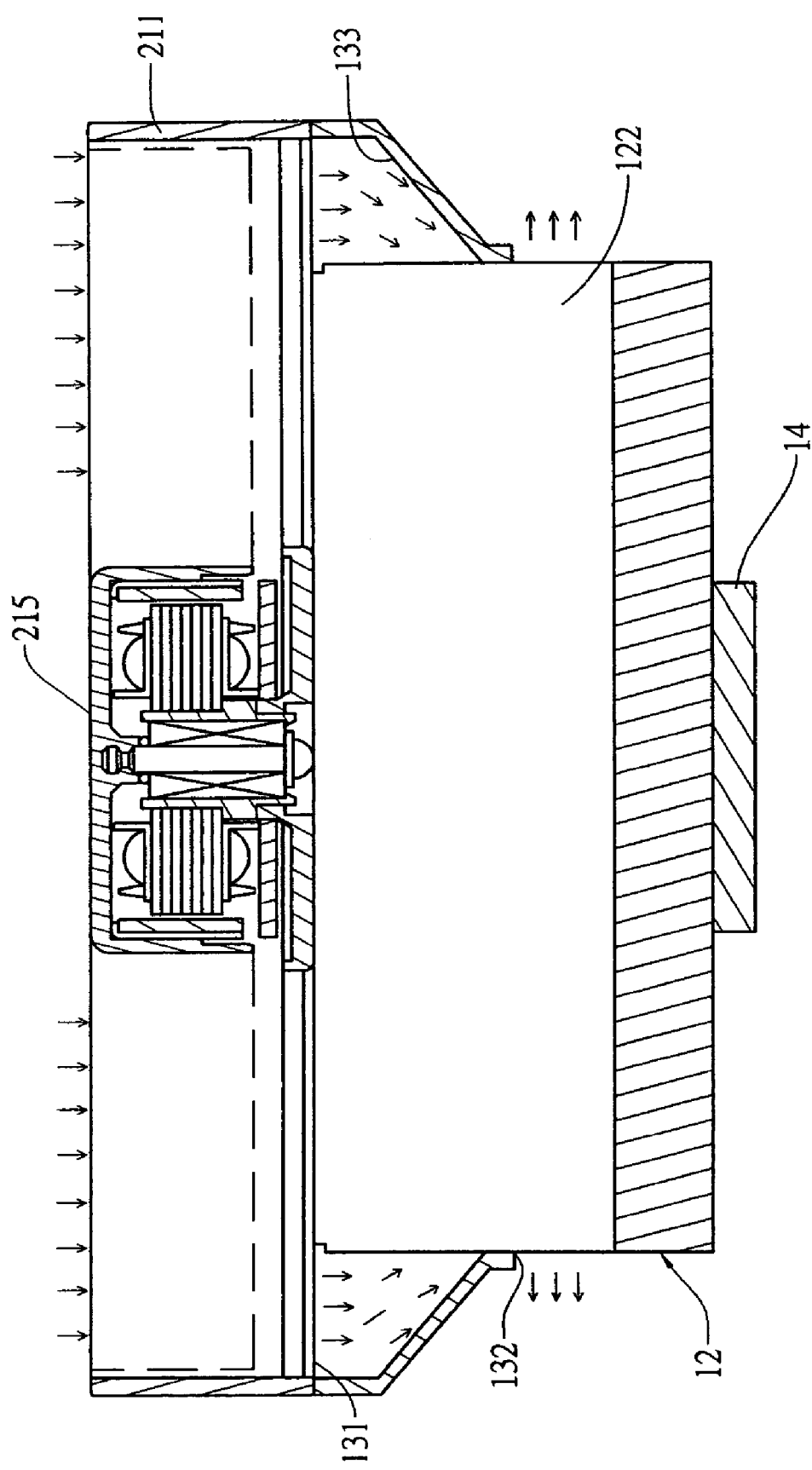
FIG. 7 is a sectional view of the second embodiment of a heat-dissipating module according to the present invention illustrating being applied to a heat emitting part.
Figure 8:
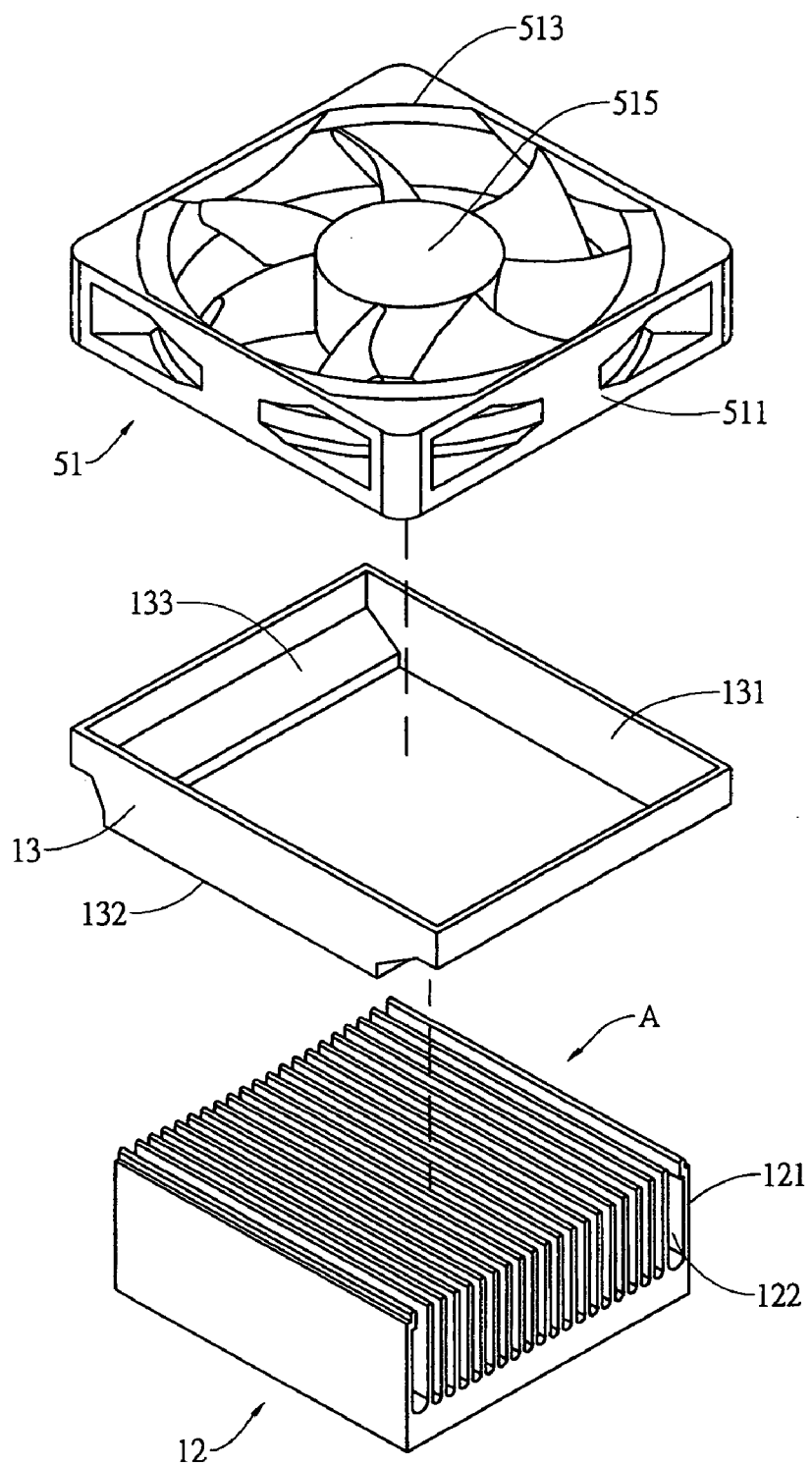
FIG. 8 is an exploded perspective view of the third embodiment of a heat-dissipating module according to the present invention.
Figure 9:
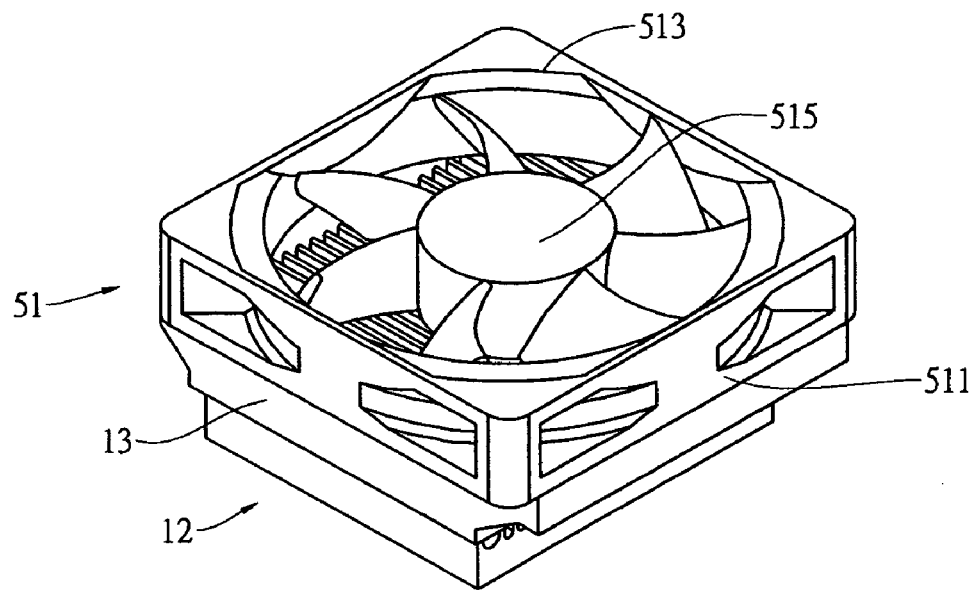
FIG. 9 is an assembled perspective view of the third embodiment of a heat-dissipating module according to the present invention.

Referring to FIG. 3 in company with FIG. 1, it can be seen that the conductive part 12 is closely attached to a heat emitting part 14 for transmitting heat from the heat emitting part 14 to cool the heat emitting part 14 directly. When the fan heel 112 rotates to move the fluid toward the conductive part 12, the fluid passes through hollow opening 113 of the base 111 to flow toward the flow passages 122 such that the heat transmitted with the conductive part 12 can be carried away from both sides of the conductive part 12. The fluid dragged by the fan wheel 112, which extends outward the outer edge of the receiving plane A, flows toward the inlet 131 and the guiding part 133 of the flow-guiding shield 13, that is, the inlet 131 and the guiding part 133 receive the fluid moved by the fan wheel 112 and flows toward the flow passages 122 of the conductive part 12 via the slant inner wall of the guiding part 133. Then, the fluid moves outward via both sides of the conductive part 12 to carry the heat transmitted with the conductive part 12 out. Hence, due to the fan wheel 112 extending outward the receiving plane A, the conductive part 12 can be acted with more fluid dragged by the fan wheel 112 to enhance heat convection efficiency and promote the overall heat dissipation effect of the heat-dissipating fan. In this way, the problem of the fan being far from the heat source can be improved completely.

Referring to FIGS. 4 to 7, the second embodiment of the present invention is illustrated. The entire structure and function of the second embodiment is about the same as the first embodiment so that the identical parts and reference numbers will not be described further in detail. The difference of the second embodiment from the first embodiment is in that the fan 21 has an annular frame 211 with a plurality of through holes 212 for being passed through with the fastener 115 so as to engage with the receiving plane A. the inner wall of the fame 211 forms a flow passage 213 and the area of the flow passage 213 is greater than the receiving plan A so that an extending zone 214 is constituted at the outer edge of the receiving plane A. The flow passage 213 receives a fan wheel 215 and the circular area of the fan wheel 215 is slightly less than the flow passage 213 and greater than the area of the receiving plane A such that the fan wheel 215 extends outward the outer edge of the receiving plane A. The guiding part 133 of the flow-guiding shield 13 can receive fluid from the extending zone 214 to achieve the preceding function.

Figure 10:
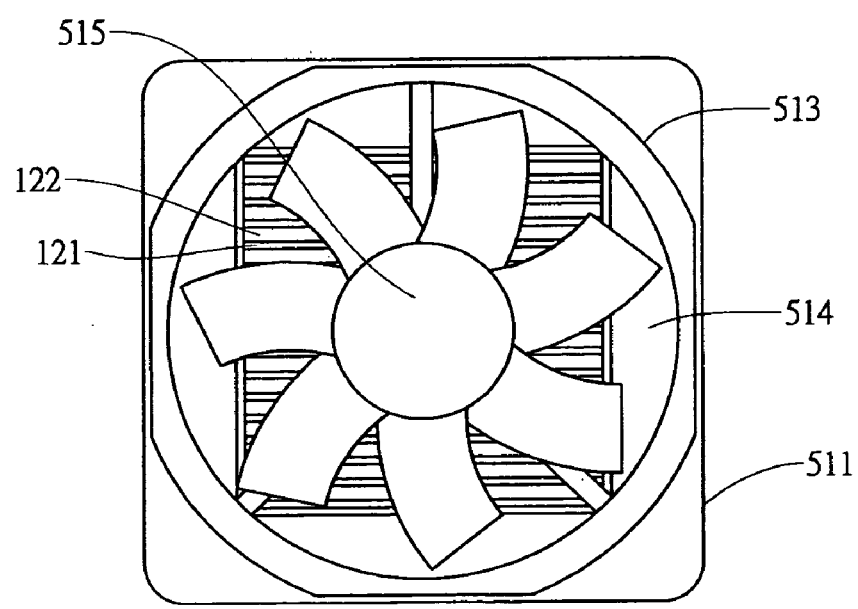
FIG. 10 is a top view of FIG. 9.
Figure 11:
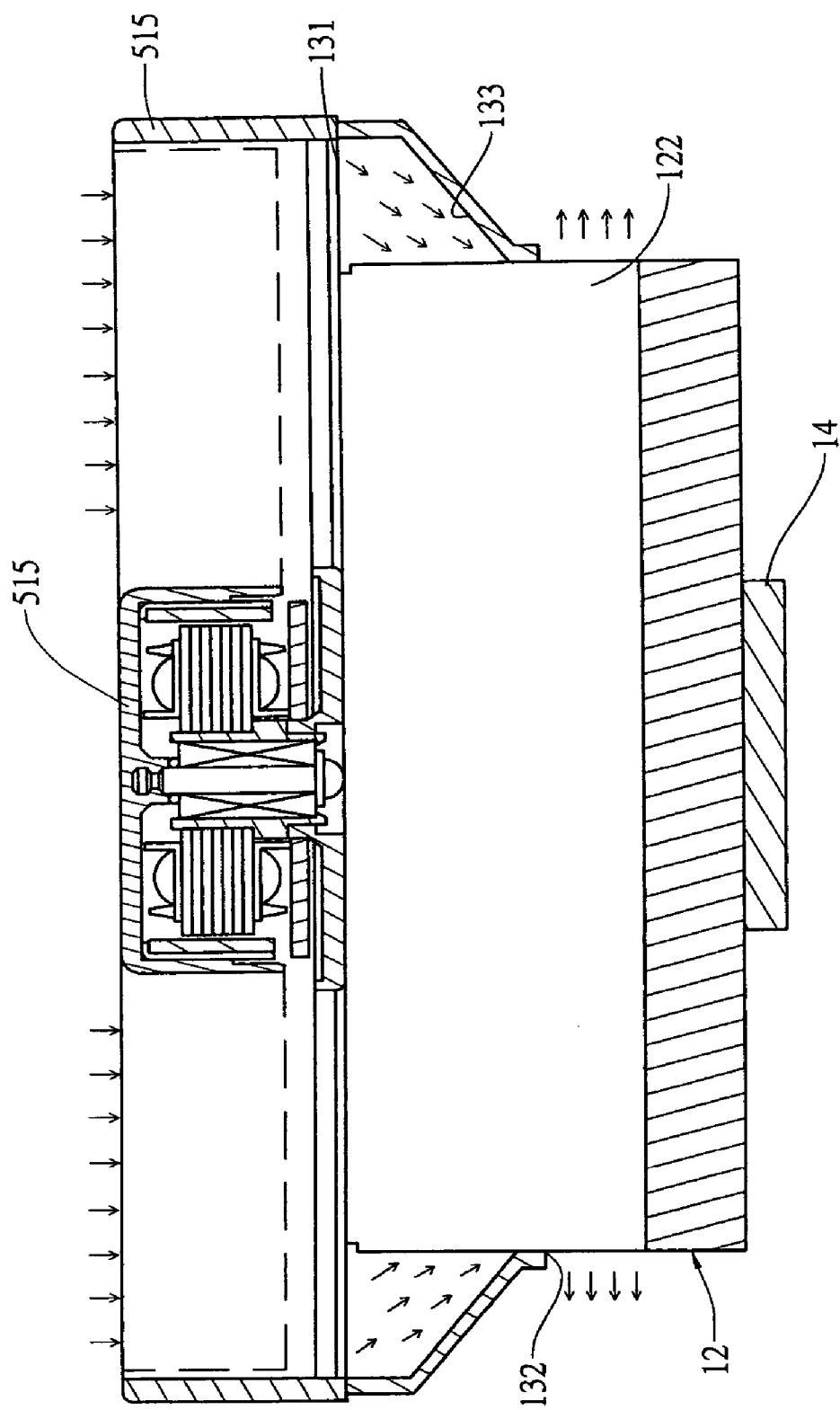
FIG. 11 is a sectional view of the third embodiment of a heat-dissipating module according to the present invention illustrating being applied to a heat emitting part.

Referring to FIGS. 8 to 11, the third embodiment of the present invention is illustrated. The entire structure and function of the third embodiment is about the same as the preceding embodiment so that the identical parts and reference numbers will not be described further in detail. The difference of the third embodiment from the second embodiment is in that the fan 51 has a square frame 511 and the inner wall of the fame 511 forms a flow passage 513 and the area of the flow passage 513 is greater than the receiving plan A so that an extending zone 514 is constituted at the outer edge of the receiving plane A as shown in FIG. 10. The flow passage 513 receives a fan wheel 515 and the circular area of the fan wheel 515 is slightly less than the flow passage 513 and greater than the area of the receiving plane A such that the fan wheel 515 extends outward the outer edge of the receiving plane A. The guiding part 133 of the flow-guiding shield 13 can receive fluid from the extending zone 514 to achieve the preceding function.

Figure 12:
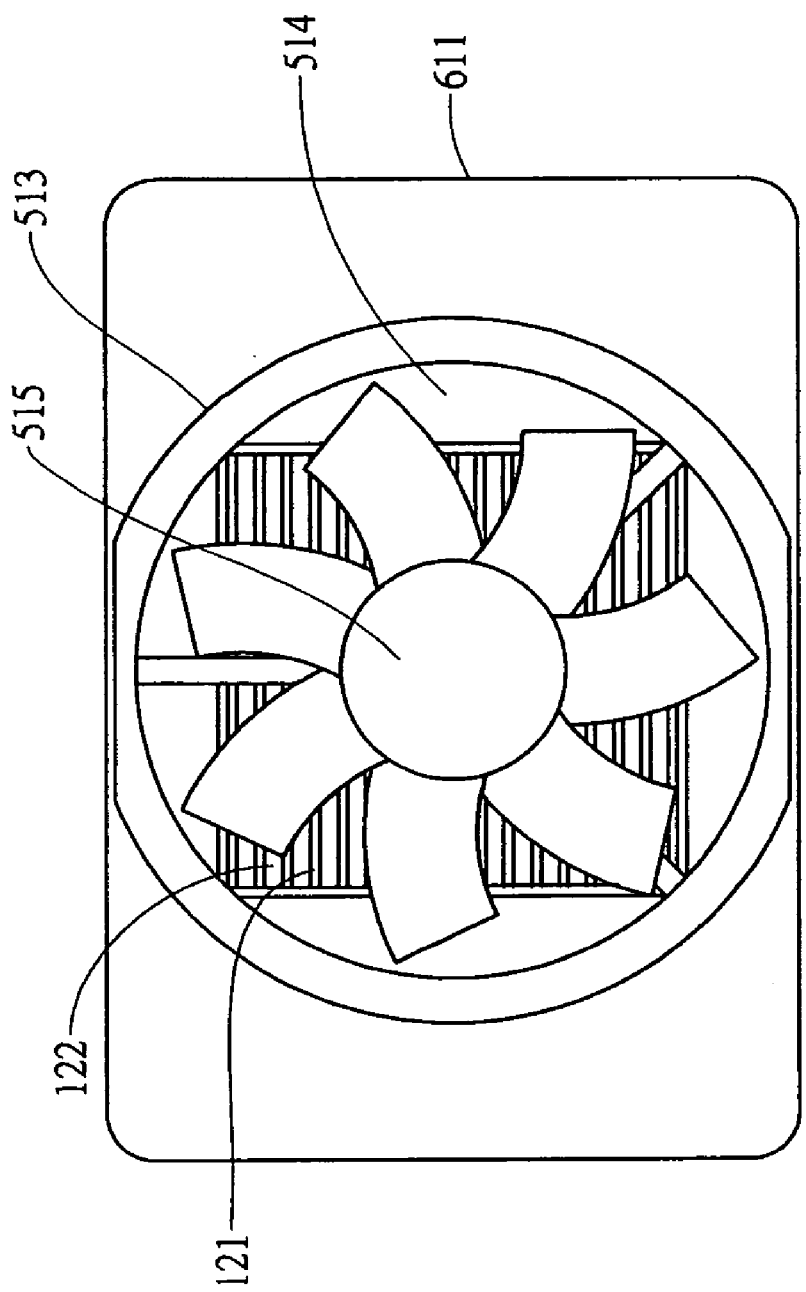
FIG. 12 is a top view illustrating another configuration of the frame in the third embodiment according to the present invention.
Figure 13:
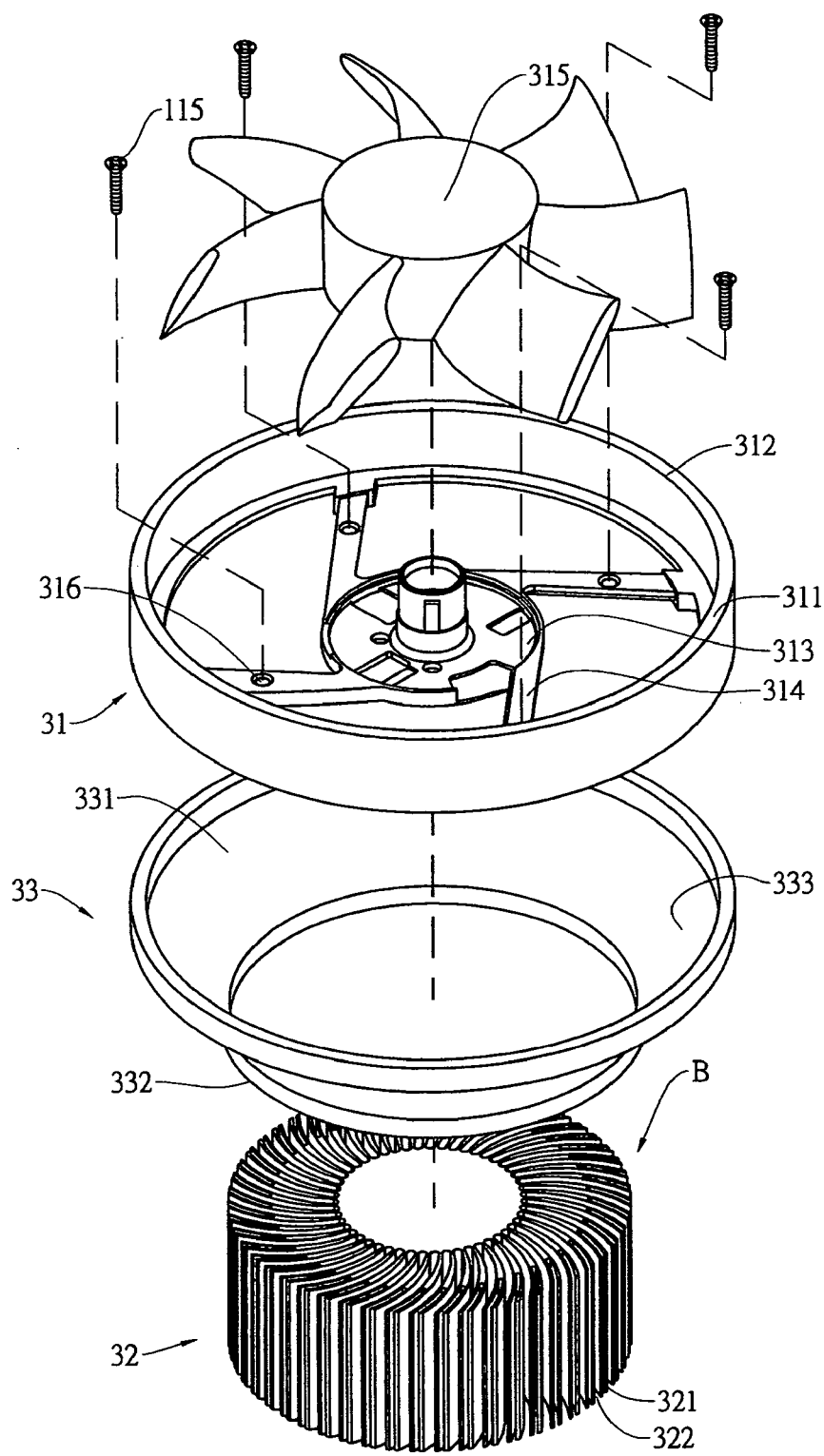
FIG. 13 is an exploded perspective view of the fourth embodiment of a heat-dissipating module according to the present invention.
Figure 14:
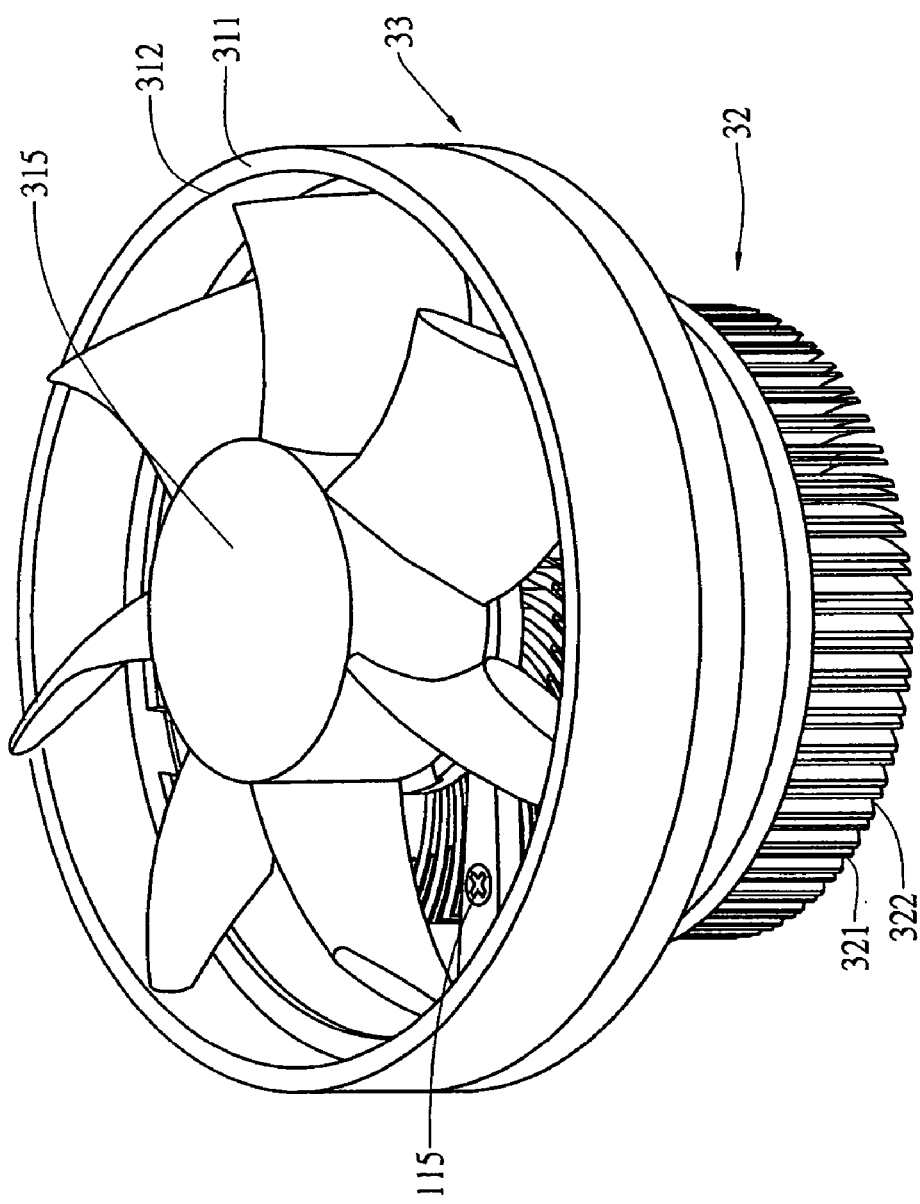
FIG. 14 is an assembled perspective view of the fourth embodiment of a heat-dissipating module according to the present invention.

Referring to FIG. 12, the fan 51 has a rectangular frame 611 instead of a square frame can achieve the preceding function too.

Figure 15:
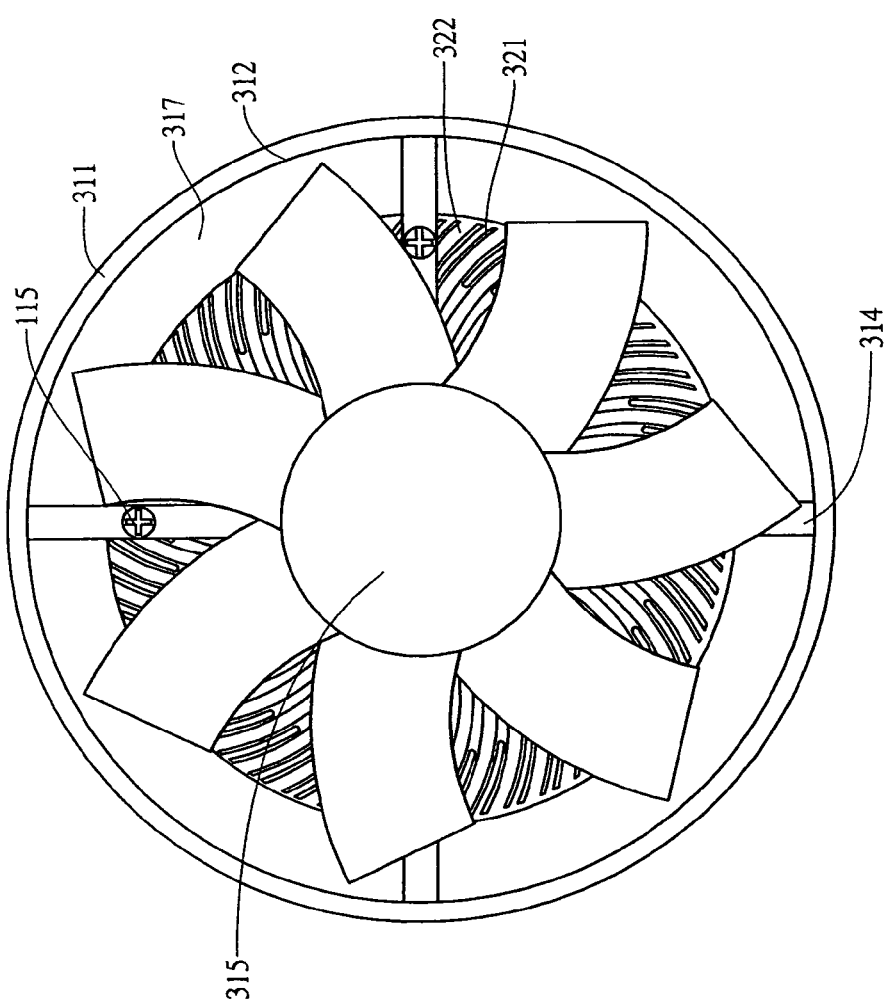
FIG. 15 is a top view of FIG. 14.
Figure 16:
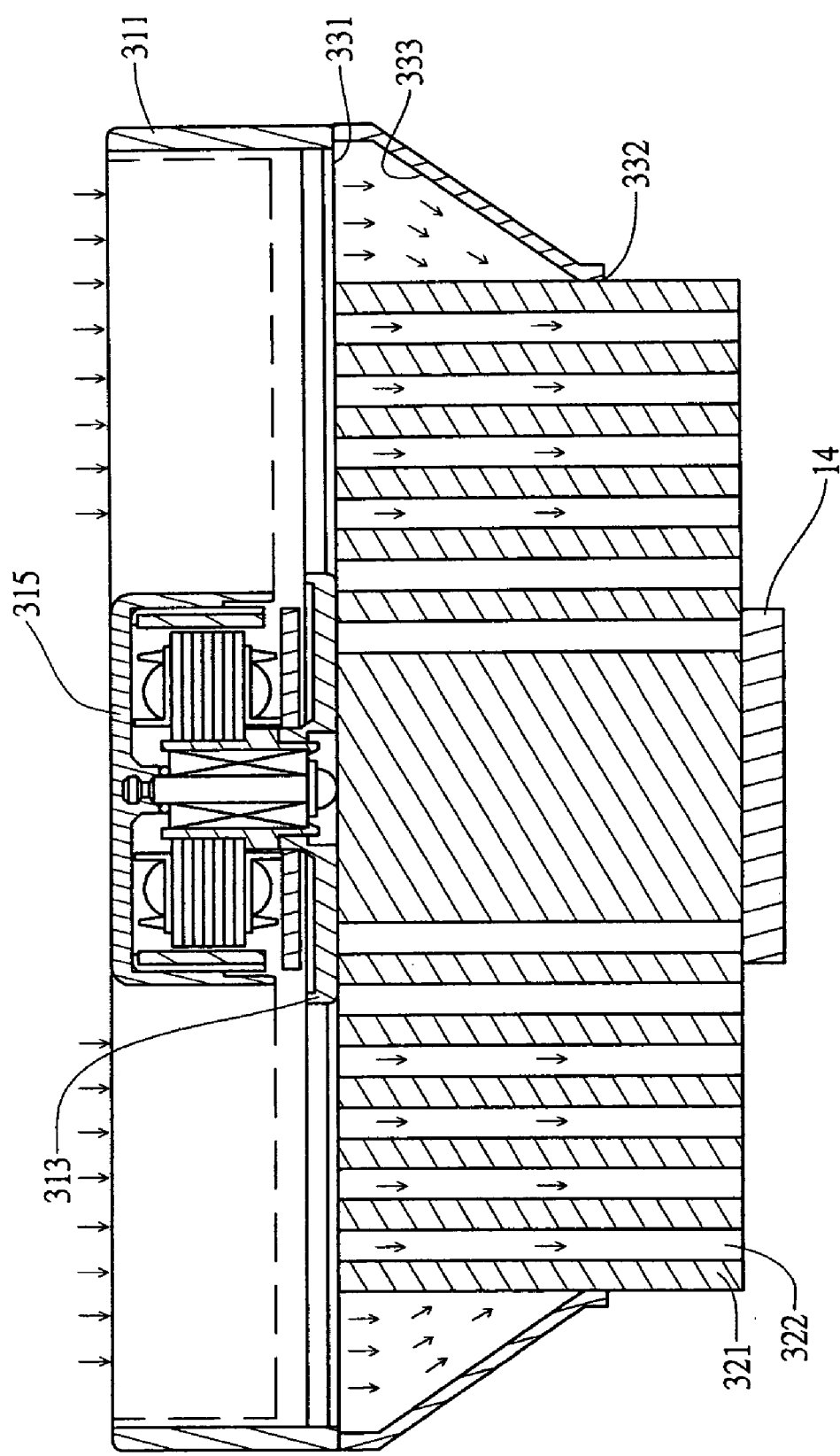
FIG. 16 is a sectional view of the fourth embodiment of a heat-dissipating module according to the present invention illustrating being applied to a heat emitting part.
Figure 17:
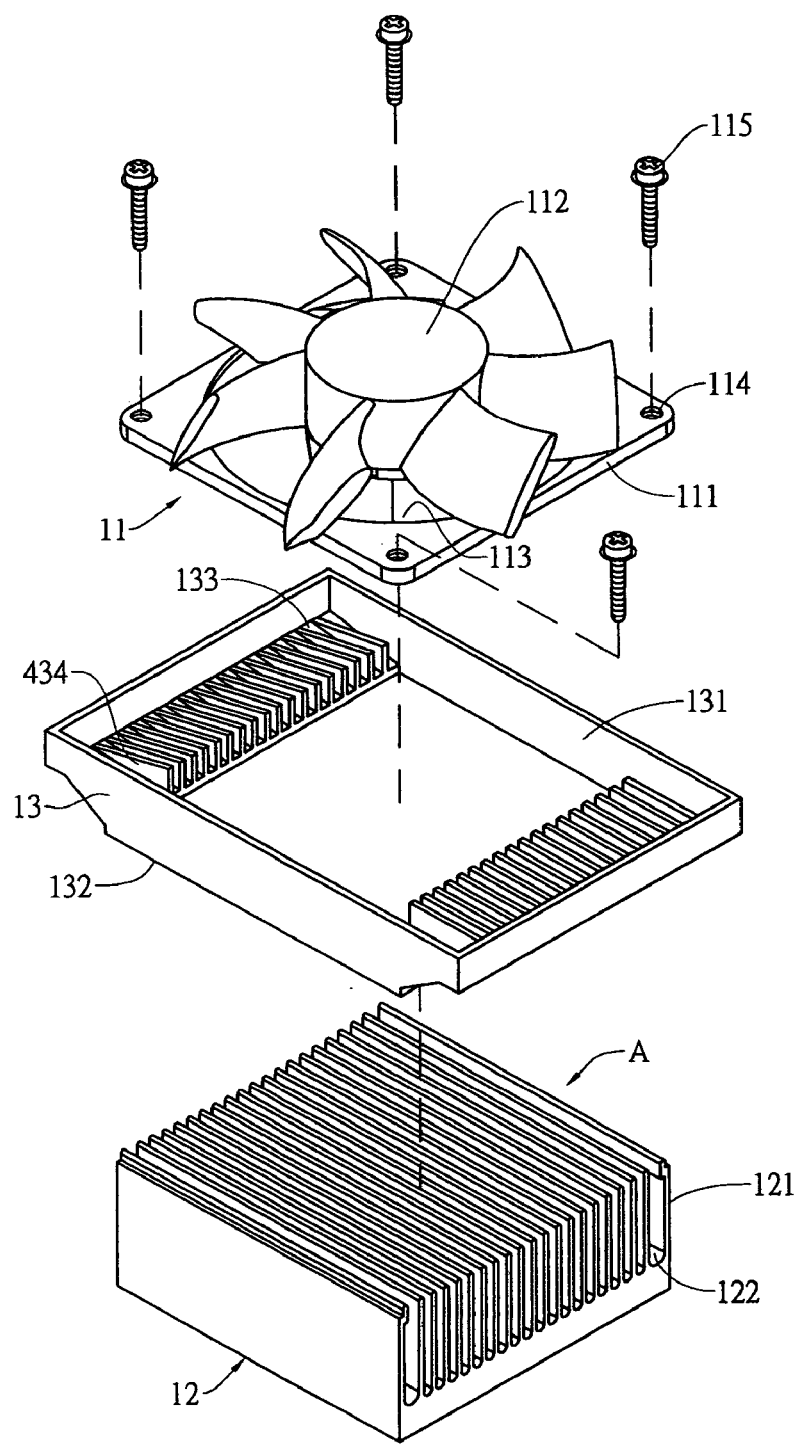
FIG. 17 is an exploded perspective view of the fifth embodiment of a heat-dissipating module according to the present invention.
Figure 18:
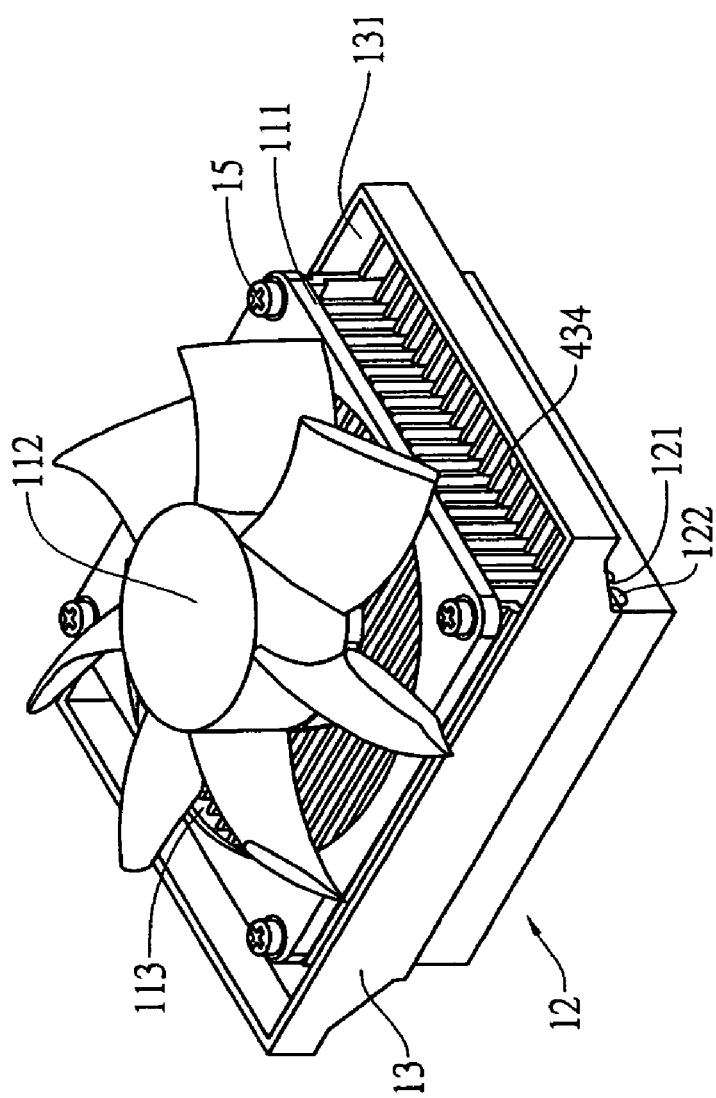
FIG. 18 is an assembled perspective view of the fifth embodiment of a heat-dissipating module according to the present invention.

Referring to FIGS. 13 to 16, the fourth embodiment of the present invention is illustrated. The entire structure and function of the fourth embodiment is almost the same as the second embodiment so that the identical parts and reference numbers will not be described further in detail. The difference of the fourth embodiment from the second embodiment is in that the conductive part 32 is cylindrical with a plurality of cooling fins 321 extending outward radially and a flow passage 322 is formed between every two of the cooling fins 321 such that a circular receiving plane B is formed with the cooling fins 321. Further, the flow-guiding shield 33 provides a circular inlet 331 and a circular outlet 332 with a slant guiding part 333 at the inlet 331. The flow guiding-shield 33 fits with the upper half outer side of the conductive part 32, i.e., the outlet 332 of the flow-guiding shield 33 is attached to the upper half part of the extending out ends of the cooling fins 321. The fan 31 has an annular frame 311 and the inner wall of the fame 311 forms a flow passage 312 and the area of the flow passage 312 is greater than the receiving plane B and a fan wheel seat 313 is disposed in the frame 311 with a plurality of holding parts 314 being provided between the fan wheel seat 313 and the frame 311. A fan wheel 315 is movably connected to the fan wheel seat 313 with a circular area thereof being slightly less than the flow passage 312 and greater than the receiving plane B. The holding parts 314 has a through holes 316 for being passed through with fastener 115 respectively so as to engage the fan 31 to the receiving plane B. The frame 311 provides a projection zone 317 extending outward the periphery of the conductive part 32 as shown in FIG. 15 and the fan wheel 315 extends beyond the periphery of the conductive part 32 and the projection zone 317 and the extending out part of the fan wheel 315 corresponds to the inlet 331 and the guiding part 333 of the flow-guiding shield 33 respectively.

Referring to FIGS. 13, 15 and 16 again, it can be seen that the conductive part 32 is closely attached to the heat emitting part 14 for transmitting heat from the heat emitting part 14 to cool the heat emitting part 14 directly. When the fan wheel 315 rotates to move the fluid toward the conductive part 32, the fluid flows toward the flow passages 322 such that the heat transmitted with the conductive part 32 can be carried away from the periphery of the conductive part 32. The fluid dragged by the fan wheel 315, which extends outward the projection zone 317 of the receiving plane B, flows toward the inlet 331 of the flow-guiding shield 33 and is guided by the slant inner wall of the guiding part 333 to flow toward the flow passages 322 of the conductive part 32 via the slant inner wall of the guiding part 133. Then, the fluid moves outward via the periphery of the conductive part 32 to carry the heat transmitted with the conductive part 32 out. In this way, it can enhance heat convection efficiency and promote the overall heat dissipation effect of the heat-dissipating fan due to the conductive part 32 receiving more fluid.

Referring to FIGS. 17 to 19 and FIGS. 20a to 20d, the fifth embodiment of the present invention is illustrated. The entire structure and function of the fifth embodiment is almost the same as the first embodiment so that the identical parts and reference numbers will not be described further in detail. The difference of the fifth embodiment from the first embodiment is in that the guiding part 133 of the flow-guiding shield 13 provides a plurality of projections 432 spacing apart from each other and each of the projections 432 is disposed next to the cooling fins 121 and corresponds to the cooling fins 121 to allow the fluid guided by guiding part 133 flows toward the flow passage 122 of the conductive part 12 via the spacing between the projections 432.

Figure 20D:
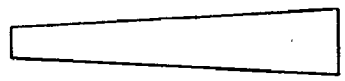
FIG. 20d is a sectional view illustrating a further configuration of the projection part in the fifth embodiment of a heat-dissipating module according to the present invention.
Figure 20B:
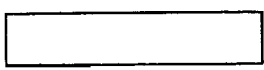
FIG. 20b is a sectional view illustrating another configuration of the projection part in the fifth embodiment of a heat-dissipating module according to the present invention.
Figure 20C:
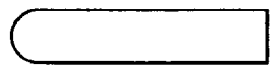
FIG. 20c is a sectional view illustrating a further configuration of the projection part in the fifth embodiment of a heat-dissipating module according to the present invention.
Figure 20A:
FIG. 20a is a sectional view illustrating projection part in the fifth embodiment of a heat-dissipating module according to the present invention.
Figure 21:
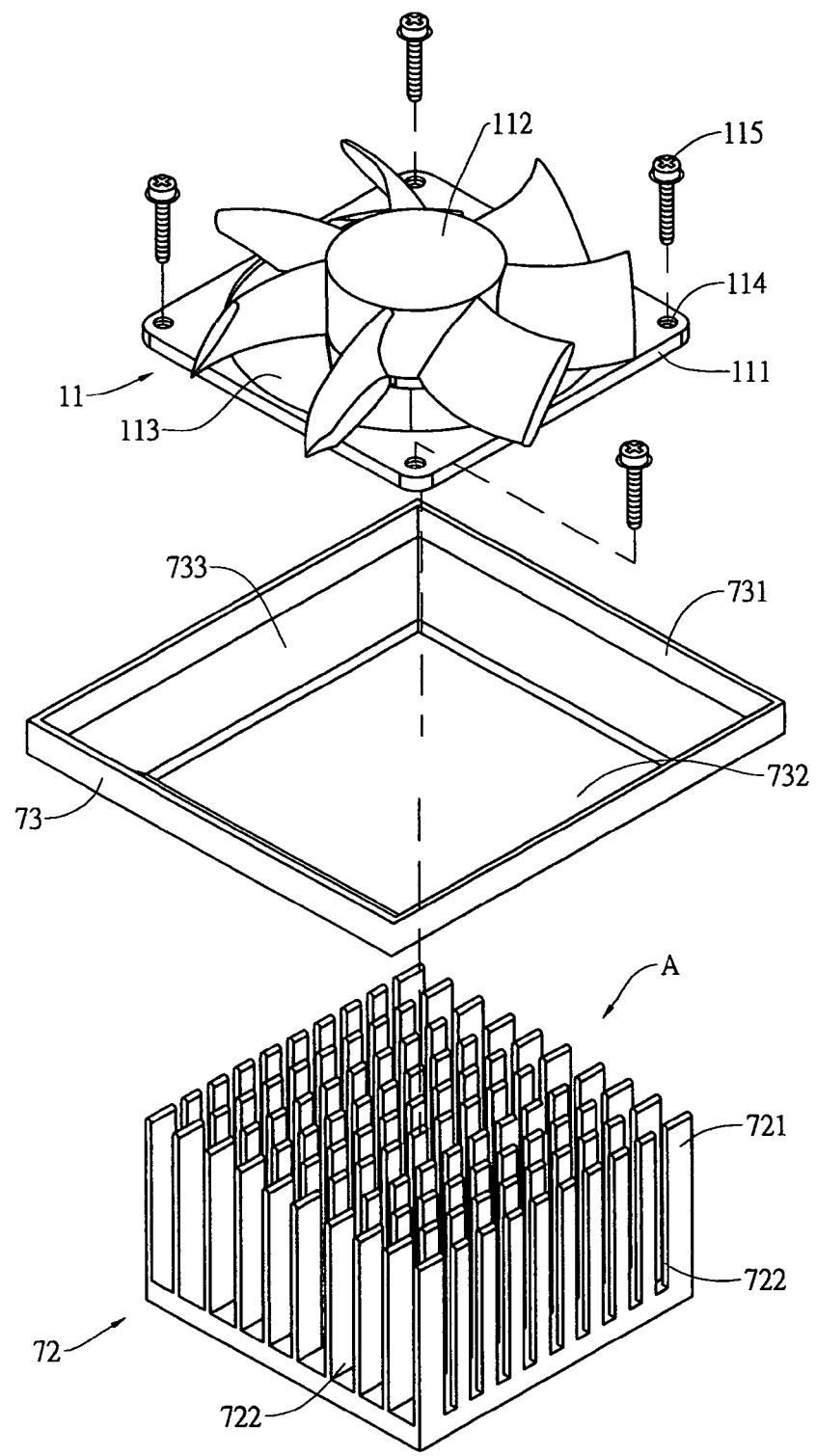
FIG. 21 is an exploded perspective view of the sixth embodiment of a heat-dissipating module according to the present invention; the present invention
Figure 22:
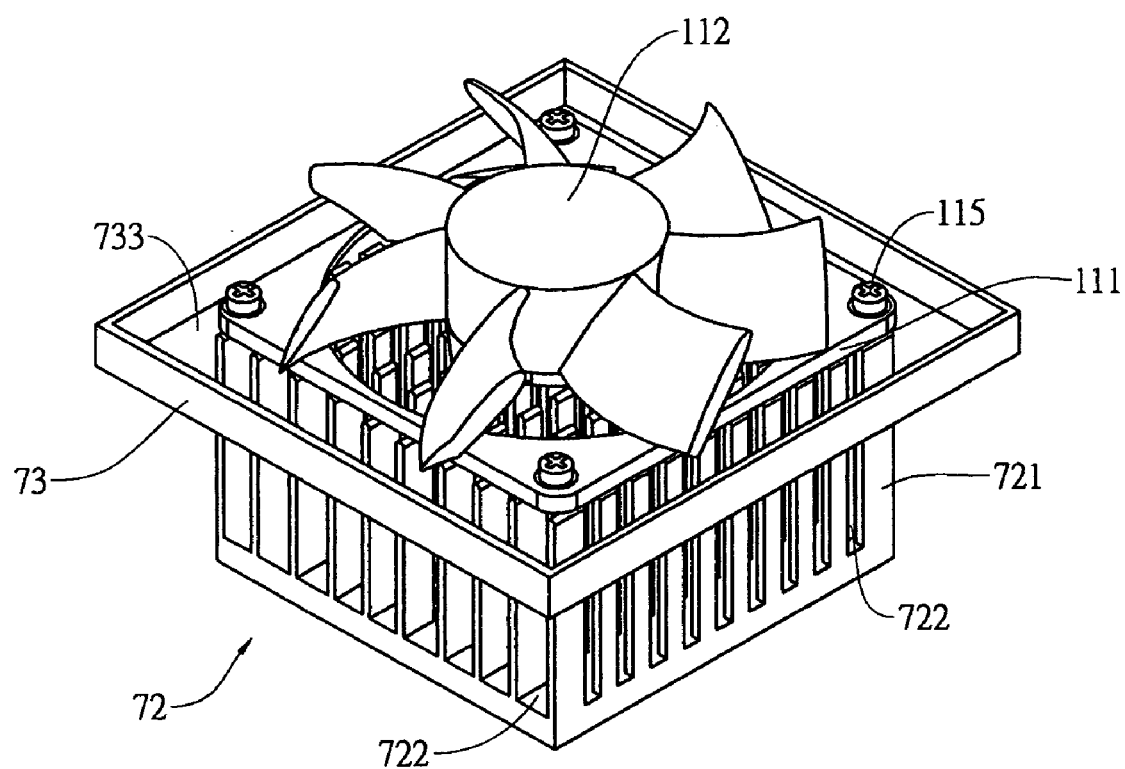
FIG. 22 is an assembled perspective view of the sixth embodiment of a heat-dissipating module according to the present invention.
Figure 23:
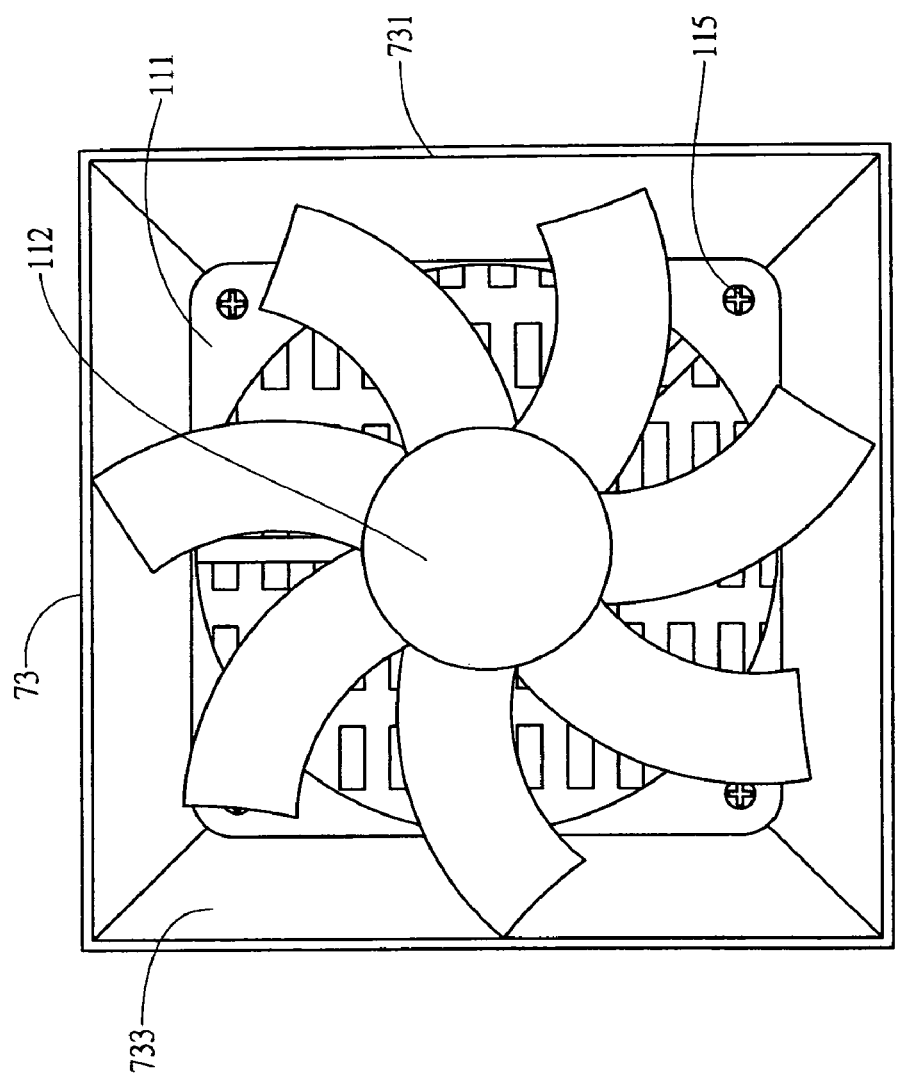
FIG. 23 is a top view of the sixth embodiment of a heat-dissipating module according to the present invention.
Figure 24:
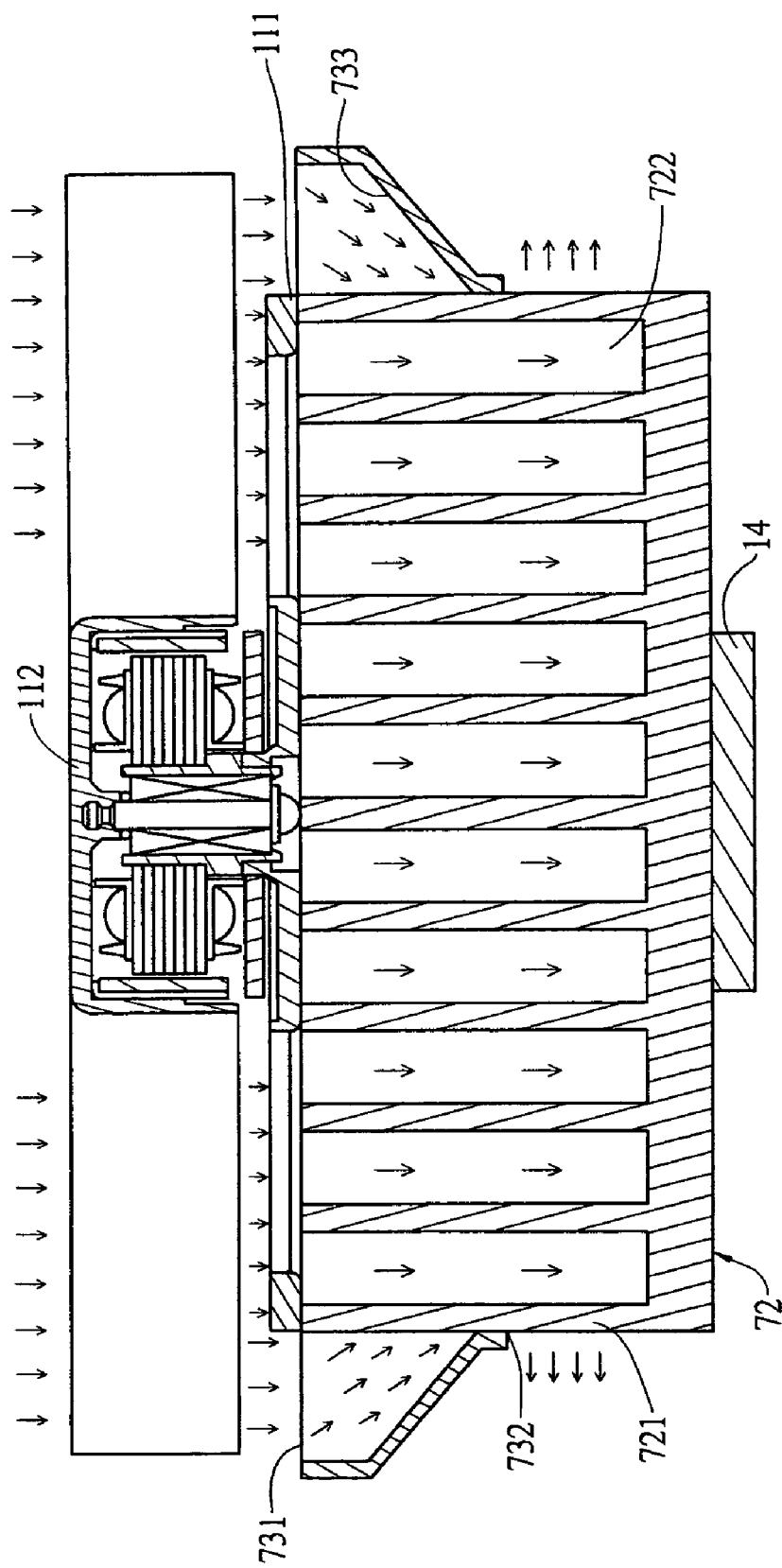
FIG. 24 is a sectional view of the sixth embodiment of a heat-dissipating module according to the present invention illustrating being applied to a heat emitting part.

Further, the projections 432 can have any shaped cross section such as triangle shown in FIG. 20a, rectangle shown in FIG. 20b, semi-ellipse shown in FIG. 20c or trapezoid shown in FIG. 20d and the projections 432 is made of good conductive material such as aluminum, copper, gold or silver.

Referring to FIGS. 21 to 24, the sixth embodiment of the present invention is illustrated. The entire structure and function of the sixth embodiment is almost the same as the first embodiment so that the identical parts and reference numbers will not be described further in detail. The difference of the sixth embodiment from the first embodiment is in that the conductive part 72 provides a plurality of post shaped up-right cooling fins 721 with a flow passage 722 between every two of the cooling fins 721 and the flow passage 722 communicates with the periphery of the conductive part 72 to allow fluid, which passes through the flow passage 731, flowing outward via the periphery of the conductive part 72. The flow-guiding shield 73 has an inlet 731 and an outlet 732 with a guiding part 733 at the side of the inlet 731 for guiding fluid from the fan 11.

When the heat-dissipating module in the sixth embodiment is set up, the inner wall of guiding part 733 at the side of the inlet 731 is provided with a slant shape and corresponds to the flow passage 722 at periphery of the conductive part 72. Once the fan wheel 112 of the fan 11 rotates, the slant inner wall of the guiding part 733 guides the fluid to move toward the flow passage 722 and flow outward via the periphery of the conductive part 72 such that heat transmitted with the conductive part 72 can be removed so as to achieve the preceding function and effect.

Figure 25:
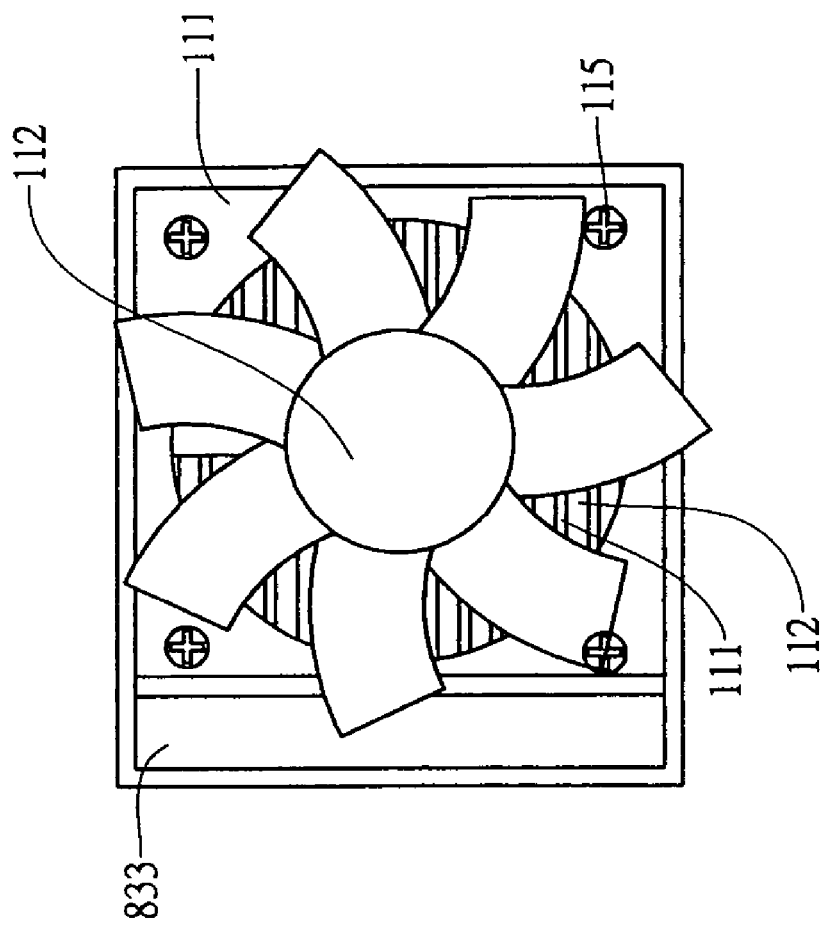
FIG. 25 is a top view of the seventh embodiment of a heat-dissipating module according to the present invention.
Figure 26:
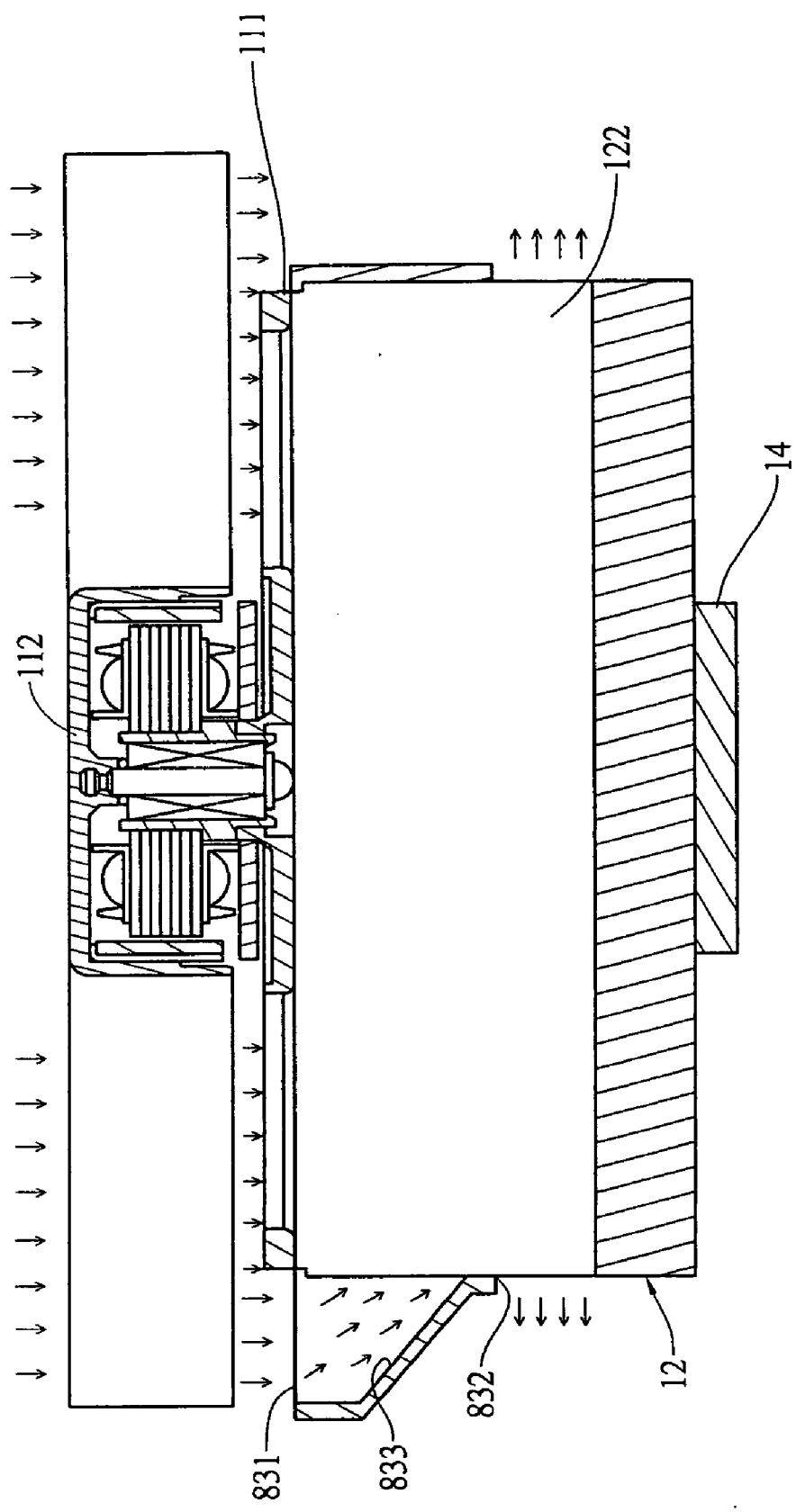
FIG. 26 is a sectional view of the seventh embodiment of a heat-dissipating module according to the present invention illustrating being applied to a heat emitting part.

Referring to FIGS. 25 and 26, the seventh embodiment of the present invention is illustrated. The entire structure and function of the seventh embodiment is almost the same as the first embodiment so that the identical parts and reference numbers will not be described further in detail. The difference of the sixth embodiment from the first embodiment is in that the flow-guiding shield 83 has an inlet 831 and an outlet 832 with a guiding part 833 being provided at the side of the inlet 831 for guiding the fluid from the fan 11. The inner wall of the guiding part 833 provides a slant shape and the guiding part 833 is next to the flow passages 122 at a side of the conductive part 12 after the flow-guiding shield 83 partly fits with the conductive part 12.

Figure 27:
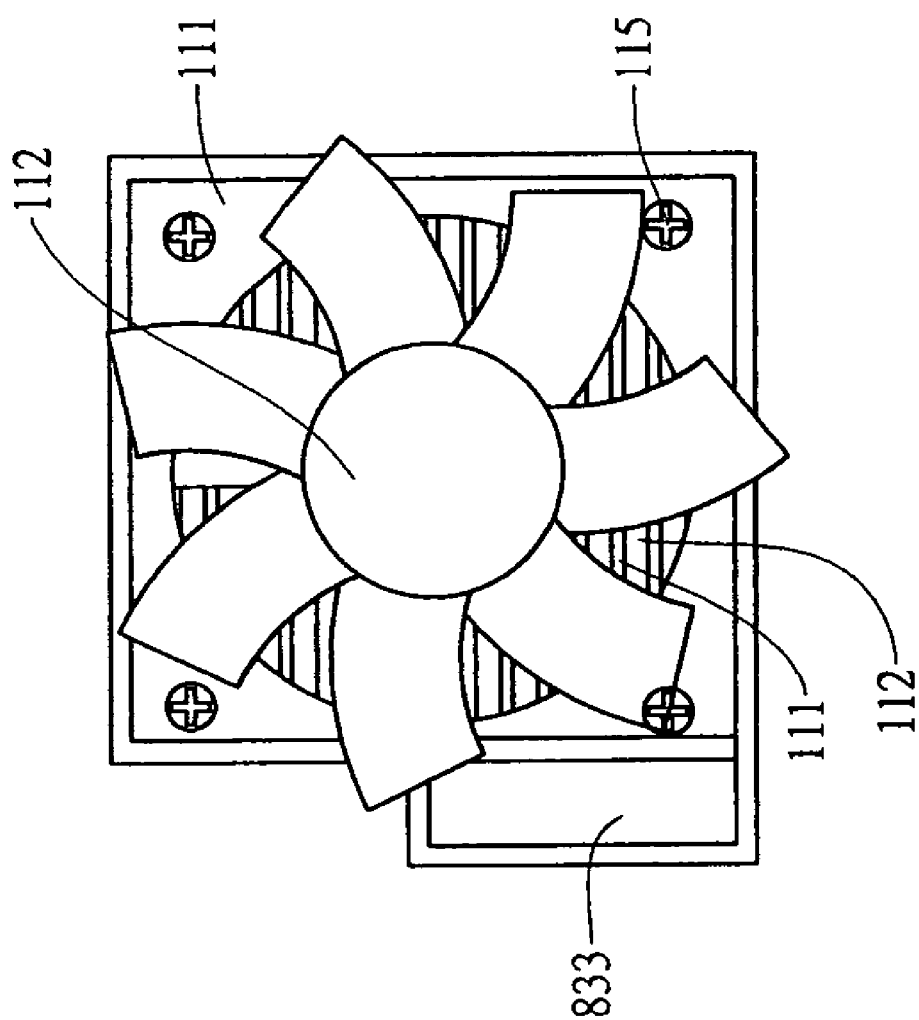
FIG. 27 is a top view of another configuration of the flow-guiding shield in the seventh embodiment of the present invention.

Referring to FIG. 27, the preceding guiding part 883 can be arranged to correspond part of the flow passages 122 such that it is possible to make flexible change for arranging the guiding part 883 under the condition of being capable of connecting with the fan wheel 112 of the fan 11 depending on space available for mounting the heat-dissipating module.

Besides, the flow-guiding shield 13, 33, 73 in the preceding embodiments can be made of good heat conductive material such as aluminum, gold or silver and can fit with ½, ⅓ or ⅔ of the upper half part of vertical length of the conductive part 12, 32, 72 instead of fitting with the upper half part of the conductive part 12, 32, 72 as long as the flow passages 122, 322, 722 can expose a part thereof without being covered with the flow-guiding shield 13, 33, 73.

While the invention has been described with referencing to preferred embodiments thereof, it is to be understood that modifications or variations may be easily made without departing from the spirit of this invention, which is defined by the appended claims.

What is claimed is:

1. A heat-dissipating module comprising:
    a radiator, having a plurality of cooling fins and a plurality of flow passages between the cooling fins, and providing a receiving plane defined by the cooling fins and the flow passages;
    a fan, being attached to the receiving plane; and
    a flow-guiding shield, providing an inlet and an outlet, at least a guiding part being disposed at the inlet side and extending inward from the inlet toward the outlet and the outlet fitting with the radiator;
    characterized in that the guiding part has an inner wall with a plurality of projections.

2. The heat-dissipating module as defined in claim 1, wherein the guiding part is made of good conductive material.

3. The heat-dissipating module as defined in claim 1, wherein each of the projections has a triangular cross section.

4. The heat-dissipating module as defined in claim 1, wherein each of the projections has a rectangular cross section.

5. The heat-dissipating module as defined in claim 1, wherein each of the projections has an ellipse cross section.

* * * * *